(12) United States Patent
Wang

(10) Patent No.: US 6,795,008 B1
(45) Date of Patent: Sep. 21, 2004

(54) SYSTEM AND METHOD TO SUBSTANTIALLY ELIMINATE GLITCH IN A DIGITAL TO ANALOG CONVERTER

(75) Inventor: Hongwei Wang, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/665,619

(22) Filed: Sep. 22, 2003

(51) Int. Cl.$^7$ .............................................. H03M 1/66
(52) U.S. Cl. ........................ 341/144; 341/136; 341/155
(58) Field of Search .............................. 341/144, 136, 341/118, 119, 155, 120

(56) References Cited

U.S. PATENT DOCUMENTS

| | | | |
|---|---|---|---|
| 6,340,939 B1 * | 1/2002 | Dedic .......................... | 341/136 |
| 6,344,816 B1 * | 2/2002 | Dedic .......................... | 341/144 |
| 2003/0043062 A1 * | 3/2003 | Dedic et al. ................. | 341/144 |
| 2003/0190007 A1 * | 10/2003 | Dedic et al. ................. | 375/377 |

* cited by examiner

Primary Examiner—Brian Young
Assistant Examiner—John B Nguyen
(74) Attorney, Agent, or Firm—Sterne, Kessler, Goldstein & Fox PLLC

(57) ABSTRACT

A system (e.g., a digital-to-analog converter (DAC)) includes a digital section and an analog section. The digital section has drivers that generate drive signals based on received digital input signals. The drive signals are received at switches in the analog section of the DAC. The switches generate analog signals therefrom. Swing values of the drive signals are limited to a predetermined amount to substantially eliminate glitch in the analog signals. The drivers can be coupled between first and second nodes that receive different power signal values. Controlling the power signal values allows for the limiting of the swing values. Limiting the swing values limits stored charged in the first and second switches, which substantially eliminates glitch in the analog signals. This can be done regardless on environmental variances (e.g., temperature variance) during operation of the DAC.

12 Claims, 5 Drawing Sheets

SYSTEM AND METHOD TO SUBSTANTIALLY ELIMINATE GLITCH IN A DIGITAL TO ANALOG CONVERTER

BACKGROUND OF THE INVENTION

1. Field of the Invention

The present invention is related to digital to analog converters.

2. Background Art

An analog section of digital-to-analog converters (DACs) usually receives complementary drive signals that are generated using a switch driver circuit. The switch driver circuit receives digital signals and generates the drive signals therefrom. The analog section uses the received drive signals to generate analog signals representative of the digital signals.

A problem can arise when a switch is turned off. The released charge from the switch being turned off is injected into an output node, which causes glitches (e.g., temporary peaks and values, for example spikes) in the analog signals. Further, a capacitive coupling between a control node and the output node can cause additional glitches. The glitches can lower the signal-to-noise ratio (SNR) at an output node. Performance of the DAC can be severely hampered if the glitches cause the SNR to cross a threshold level.

Therefore, what is needed is a system and method that substantially eliminate glitches in an output analog signal.

BRIEF SUMMARY OF THE INVENTION

Embodiments of the present invention provide a system that substantially eliminates glitches. The system includes first and second drivers configured to receive first and second respective digital signals and generate first and second respective drive signals therefrom. The first and second drivers are coupled between first and second nodes. The system also includes first and second switches configured to receive respective ones of the first and second drive signals and generate first and second respective analog signals therefrom. A difference in power signal values received at respective ones of the first and second nodes is set to a predetermined amount, such that a glitch in the first and second analog signals is substantially eliminated.

Other embodiments of the present invention provide a method for substantially eliminating glitch. The method includes coupling first and second drivers between first and second nodes receiving first and second power supply values, such that respective swing values in respective first and second drive signals is limited. The method also includes driving respective first and second switches with the first and second drive signals to produce first and second respective analog signals. The limit in the swing values in the drive signals substantially eliminates glitches in first and second analog signals.

Still other embodiments of the present invention provide a method for substantially eliminating glitch. The method includes coupling first and second drivers between ground and a power supply, such that a swing value in respective first and second drive signals is limited. The method also includes driving respective first and second switches with the first and second drive signals to produce first and second respective analog signals. The limit in the swing value in the drive signals substantially eliminates glitches in first and second analog signals.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
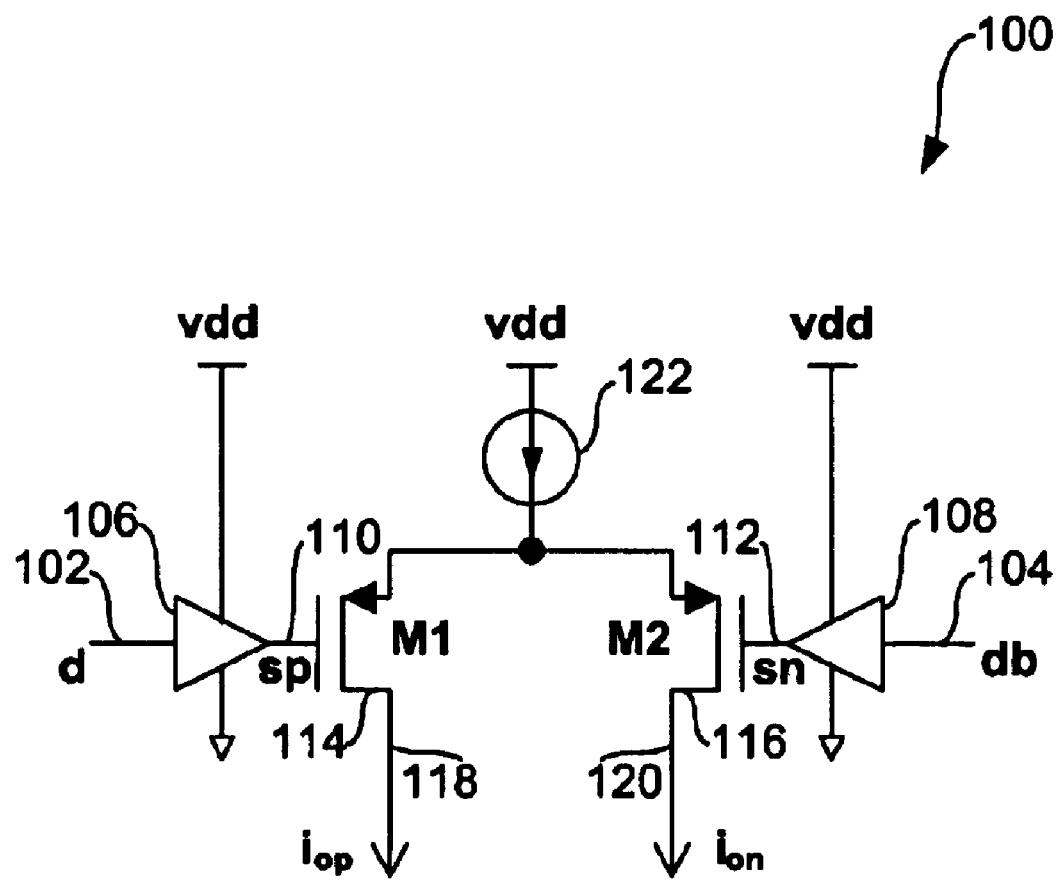
FIG. 1 is a schematic diagram of one element cell in a digital-to-analog converter (DAC).

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Embodiments of the present invention provide a system (e.g., a digital-to-analog converter (DAC)) including a digital section and an analog section. The digital section has drivers that generate drive signals based on received digital input signals. The drive signals are received at switches in the analog section of the DAC. The switches generate analog signals therefrom.

Swing values of the drive signals are limited to a predetermined amount to substantially eliminate glitch in the analog signals. The drivers can be coupled between first and second nodes that receive different power signal values. Controlling the power signal values allows for the limiting of the swing values. Limiting the swing values limits stored charges in the switches, and also limit capacitor coupled charges, which substantially eliminates glitches in the analog signals. This can be done regardless of environmental variances (e.g., temperature variance) during operation of the DAC.

It is to be appreciated that, although systems are shown that substantially eliminate glitch in a DAC, the system can be used in any application in which glitch occurs. Therefore, all other applications that require substantial elimination of glitch are contemplated within the scope of the present invention.

Digital to Analog Converter

FIG. 1 is a schematic diagram of a system 100 (e.g., one element cell of a digital-to-analog converter (DAC)). Complementary digital signals d 102 and db 104 are received at drivers 106 and 108, respectively. Drivers 106 and 108 generate complementary drive signals sp 110 and sn 112, respectively, therefrom. Switches 114 and 116 (e.g., p-type metal oxide semiconductor field effect transistors (MOSFETS) M1 and M2, or any other switch device) receive drive signals sp 110 and sn 112, respectively, at a control terminal (e.g., a gate), and generate analog signals ion 118 and ion 120, respectively, therefrom. Switches M1 114 and M2 116 are biased using a current source 122, which is coupled between sources of switches M1 114 and M2 116 and a bias power supply Vdd. As discussed above, when switches M1 114 or M2 116 turn OFF, they release stored charge into analog nodes ion 118 or ion 120, which can cause glitches in signals ion 118 or ion 120. The glitches can also be caused through coupling capacitor of M1 114 between sp 110 and ion 118, and coupling capacitor of M2 116 between sn 112 and ion 120.

It is to be appreciated an array of systems 100 can be used to form a multi-bit DAC, as would be apparent to one of ordinary skill in the art. Also, although switches are shown as MOSFETS, all other known devices that can function as switches can also be used, and are contemplated within the scope of the present invention.

Exemplary Glitch Compensation Scheme for a Switch of a DAC

Figure 2:
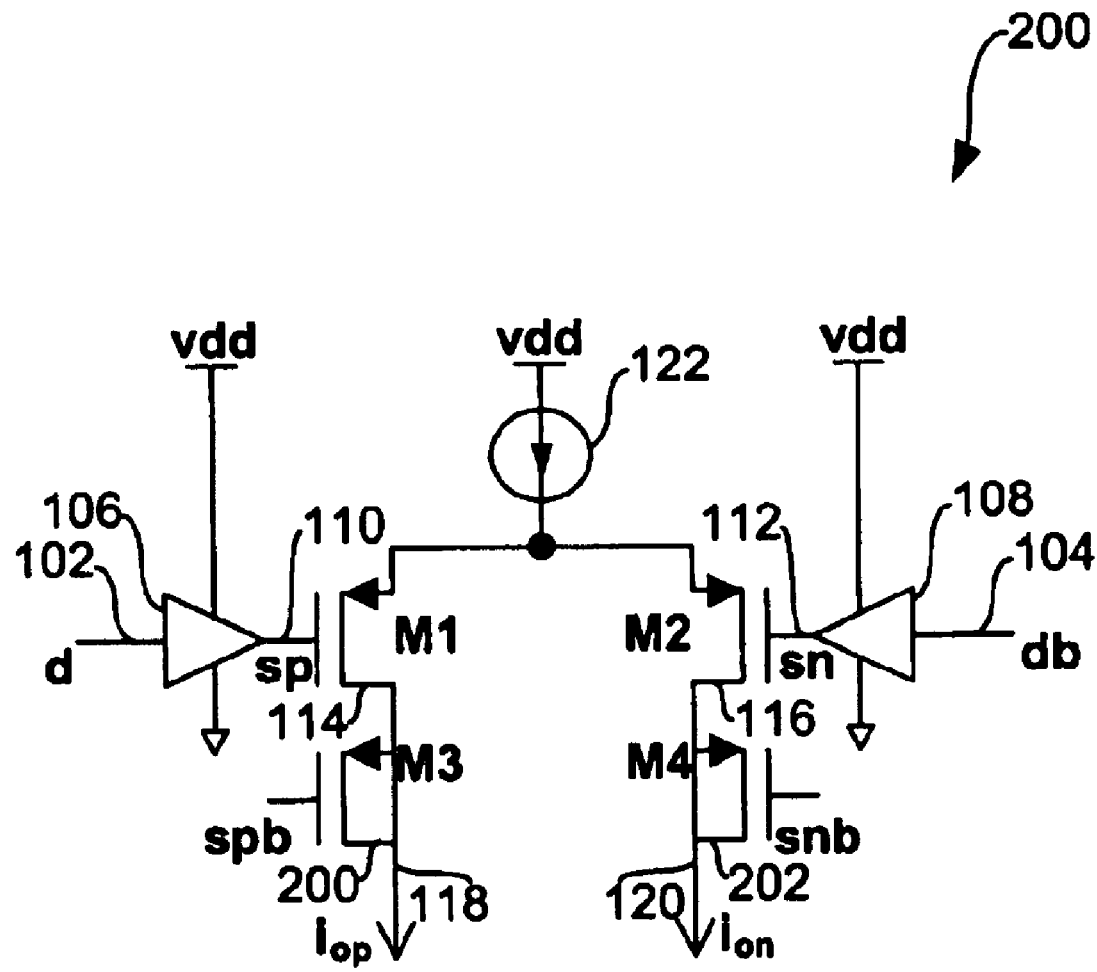
FIG. 2 is a schematic diagram of glitch compensation systems used in the system of FIG. 1.

FIG. 2 is a schematic diagram of a system 200. System 200 can allow for glitch compensation. In this configuration, "dummy switches" M3 200 and M4 202, which have their drains coupled to their sources to short switches M3 200 and M4 202, are in series with switches M1 114 and M2 116.

Switch M3 200 is driven using signal spb 204, which is substantially inverse (or complementary) to sp 110. Similarly, switch M4 202 is driven using signal spn 206, which is substantially inverse to sn 112. Switch M3 200 turns ON when switch M1 114 turns OFF, such that switch M3 200 ideally absorbs substantially all the released charge from switch M1 114. Similarly, switch M4 202 turns ON when switch M2 116 turns OFF, such that switch M4 202 ideally absorbs substantially all the released charge from switch M2 116.

In operation, switches M3 200 and M4 202 can only absorb substantially all the charge from switches M1 114 and M2 116, respectively, if they are within strict tolerances for a given application. If the specifications of the application and/or the devices fall outside the tolerances, glitches can still exist in analog signals ion 118 and ion 120. Also, turn-on and turn-off times of pairs of the switches M1 114/M3 200 and M2 116/M4 202 are typically not strictly simultaneous, which can also allow glitches to occur in ion 118 and ion 120.

Figure 3:
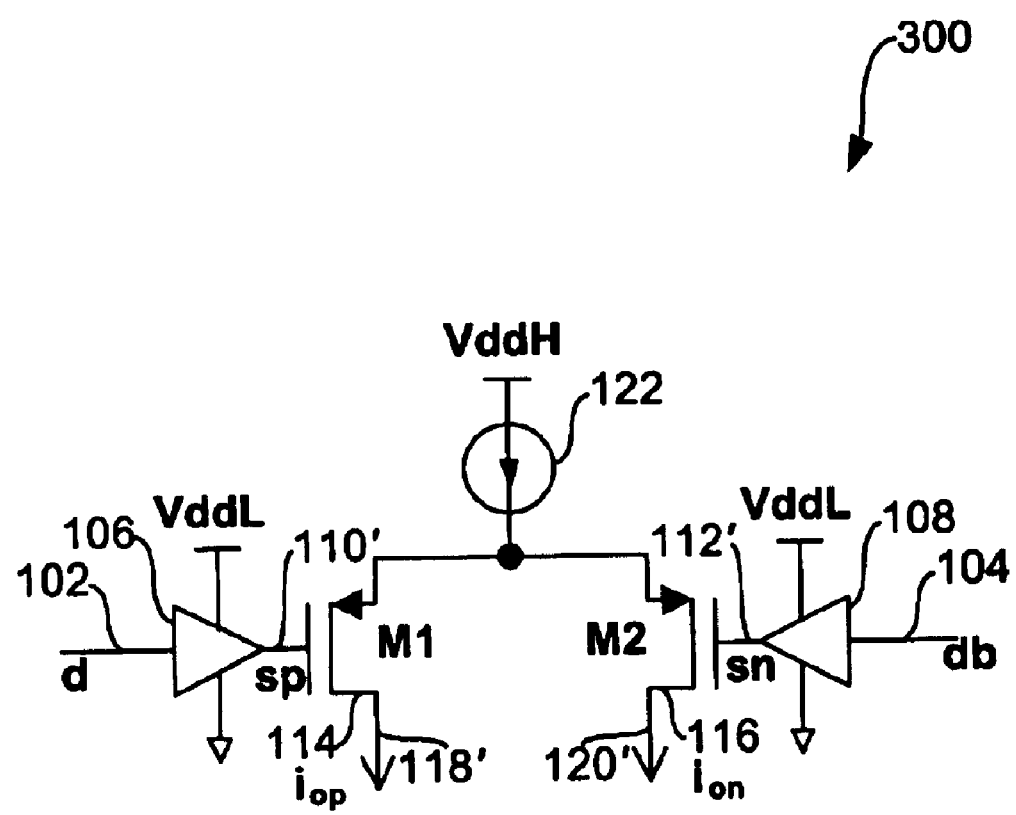
FIGS. 3 and 4 are schematic diagrams of various configurations of the system used in FIG. 1 that substantially eliminate glitch according to various embodiments of the present invention.
Figure 4:
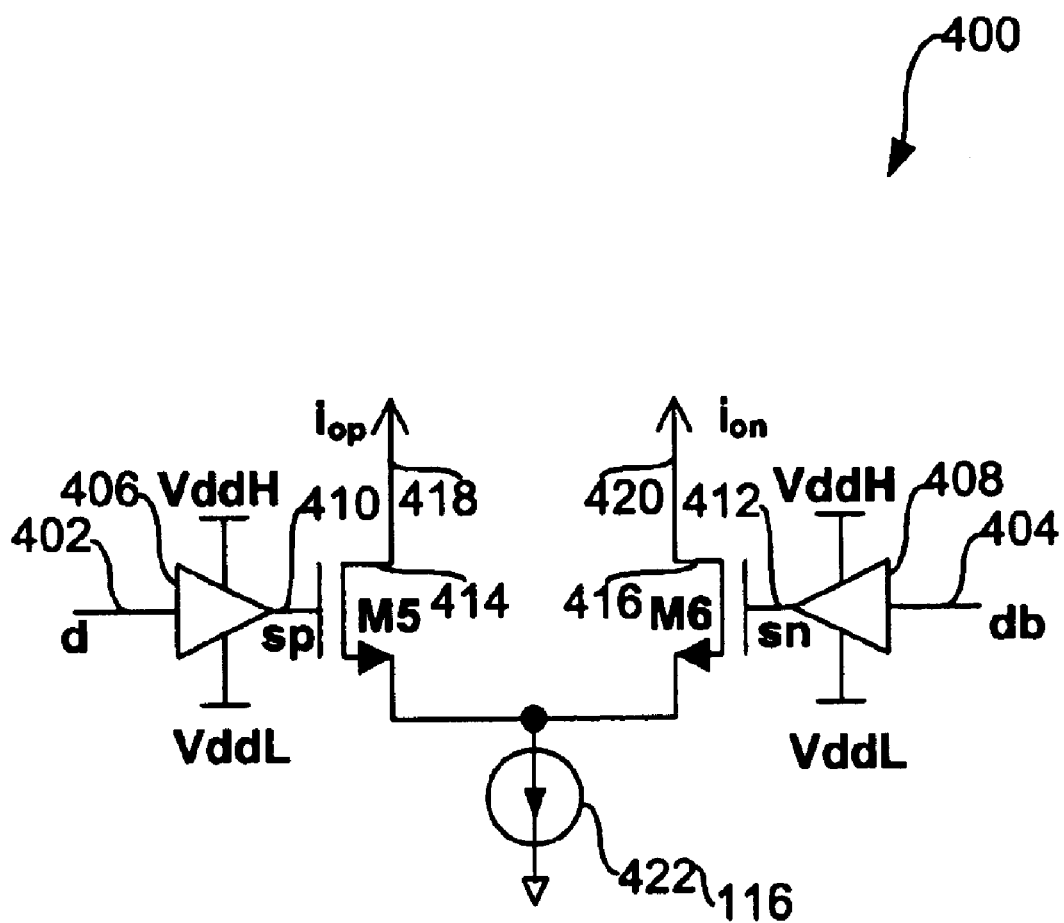

Using systems shown in FIGS. 3 and 4 can substantially eliminate glitches one or more orders of magnitude compared to using the dummy switches in FIG. 2.

Substantially Eliminating Glitch in an Analog Signal Output from a DAC

FIG. 3 is a schematic diagram of a system 300 that substantially eliminates glitch according to embodiments of the present invention. In system 300, drivers 106 and 108 are coupled between a first node receiving power supply signal VddL, which is lower than power supply signal VddH (e.g., Vdd in FIGS. 1–2), and a second node coupled to ground.

In this configuration, a swing value in drive signals sp 110' and sn 112' is substantially reduced. For example, VddH can be about 2.5 Volts and VddL can be about 1.2 Volts, so that a swing value can be about 1.2 Volts (e.g., about half of the swing value in drive signals of systems 100 and/or 200, which swing between ground and Vdd, usually about 0 Volts to about 2.5 Volts).

Reducing the swing value in drive signals sp 110' and sn 112' also reduces stored charge in switches M1 114 and M2 116. Reducing the swing also reduces the charges transferred through the coupling capacitors between the control node and output node of the switches. With these two factors, glitch is substantially eliminated in ion 118' and ion 120'. Accordingly, the substantial reduction in the glitches at ion 110' and ion 112' will insignificantly increase the SNR of the DAC. This is true regardless of an application or operational parameters of system 300.

FIG. 4 is a schematic diagram of a system 400 that substantially eliminates glitch according to embodiments of the present invention. Complementary digital signals d 402 and db 404 are received at drivers 406 and 408, respectively. Drivers 406 and 408 generate complementary drive signals sp 410 and sn 412, respectively, therefrom. Switches 414 and 416 (e.g., n-type MOSFETS) receive drive signals sp 410 and sn 412, respectively, at a control terminal (e.g., a gate), and generate analog signals ion 418 and ion 420, respectively, therefrom. A current source 422 is coupled between the sources of M5 414 and M6 416 and a ground node.

Drivers 406 and 408 are coupled between nodes receiving signals from power supplies VddH (e.g., Vdd in FIGS. 1 and 2) and VddL. The power supply signal from VddH is higher than the power supply signal from VddL. For example, VddH can be about 2.5 Volts and VddL can be about 1.2 Volts. Thus, a swing value of drive signals sp 410 and sn 412 is about 1.3 Volts, which is about equal to the swing value of drive signals sp 110' and sn 112' discussed above. Thus, glitch caused by release of charge from M5 414 and M6 416 can be substantially eliminated, as discussed above.

Figure 5:
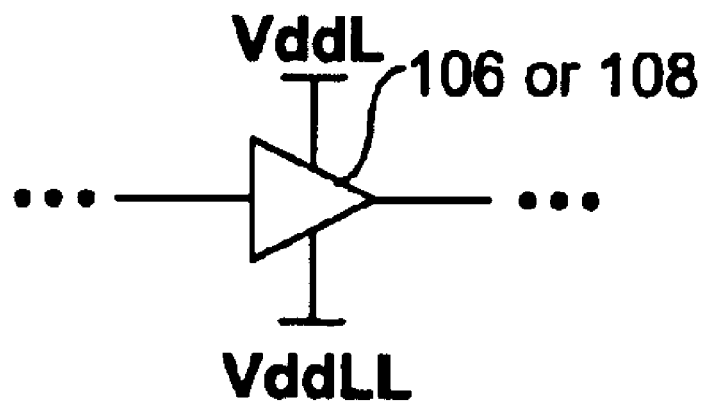
FIG. 5 shows a schematic diagram of a driver that substantially eliminates glitches according to various embodiments of the present invention.

FIG. 5 is schematic diagram of a configuration of driver 106 or 108 according to embodiments of the present invention. In this embodiment, drivers 106 and 108 are coupled between VddL and VddLL. The relationship between these power supplies and VddH is:

$$VddL > VddLL > Ground$$

$$VddL - VddLL < VddH$$

For example, if VddH is about 2.5 Volts, VddL can be about 2.0 Volts, and VddLL can be between about 1 Volt, so that a swing value can be about 1.0 Volts. Thus, glitch caused by release of charge from M1 114 and M2 116 can be substantially eliminated, as discussed above.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system that substantially eliminates glitch comprising:

first and second drivers configured to receive first and second respective digital signals and generate first and second respective drive signals therefrom, the first and second drivers coupled between first and a second nodes; and first and second switches configured to receive respective ones of the first and second drive signals and generate first and second respective analog signals therefrom, wherein a difference in power signal values received at respective ones of the first and second nodes is set to a predetermined amount, such that a glitch in the first and second analog signals is substantially eliminated.

2. The system of claim 1, wherein:

the first and second switches are p-type transistors biased using a power supply.

3. The system of claim 2, wherein:

the first node receives a power signal having a value lower than the power supply; and the second node is coupled to ground.

4. The system of claim 1, wherein the first and second switches are n-type transistors biased via a node coupled to ground.

5. The system of claim 4, wherein:

the first node receive a power signal from a first voltage source; and the second node receives a power signal from a second voltage source.

6. The system of claim 1, wherein the difference between the power signal values received at the first and second nodes determines respective swing values in the first and second drive signals.

7. The system of claim 6, wherein the swing values limit charge stored in the first and second switches.

8. A method for substantially eliminating glitch comprising:

coupling first and second drivers between first and second nodes receiving first and second power supply values, such that a swing value in respective first and second drive signals is limited; and driving respective first and second switches with the first and second drive signals to produce first and second respective analog signals, wherein the limit in the swing value in the drive signals substantially eliminates glitches in first and second analog signals.

9. The method of claim 8, further comprising:

coupling the first node to a first voltage source that generates the first power supply value; and coupling the second node to a second voltage source that generates the second power supply value, wherein the first and second voltage sources have different voltage values.

10. The method of claim 8, further comprising using the limiting of the swing values to limit stored charge in the first and second switches.

11. A method for substantially eliminating glitch comprising:

coupling first and second drivers between ground and a power supply, such that a swing value in respective first and second drive signals is limited; and driving respective first and second switches with the first and second drive signals to produce first and second respective analog signals, wherein the limit in the swing value in the drive signals substantially eliminates glitches in first and second analog signals.

12. The method of claim 11, further comprising using the limiting of the swing values to limit stored charge in the first and second switches.

* * * * *